(12) United States Patent
Janssen et al.

(10) Patent No.: US 6,222,424 B1
(45) Date of Patent: Apr. 24, 2001

(54) OPTICALLY PUMPED ATOMIC FREQUENCY STANDARD

(75) Inventors: Daniel E. Janssen, Hamilton; Martin W. Levine, Manchester, both of MA (US)

(73) Assignee: Kernco, Inc., Danvers, MA (US)

( * ) Notice: Subject to any disclaimer, the term of this patent is extended or adjusted under 35 U.S.C. 154(b) by 0 days.

(21) Appl. No.: 09/443,022

(22) Filed: Nov. 18, 1999

(51) Int. Cl.[7] .................................................. H03L 7/26
(52) U.S. Cl. ........................ 331/94.1; 331/3; 372/27; 372/31

(58) Field of Search ................ 331/94.1, 3; 372/26, 372/29, 27, 31; 324/304; 359/181, 187

(56) References Cited

FOREIGN PATENT DOCUMENTS

356017091 * 2/1981 (JP).

* cited by examiner

*Primary Examiner*—Arnold Kinkead
(74) *Attorney, Agent, or Firm*—Barry R. Blaker

(57) ABSTRACT

An improved optically pumped atomic frequency standard in which excitation light intensity entering the resonance cell is controlled and maintained independently of the optical pump.

7 Claims, 1 Drawing Sheet

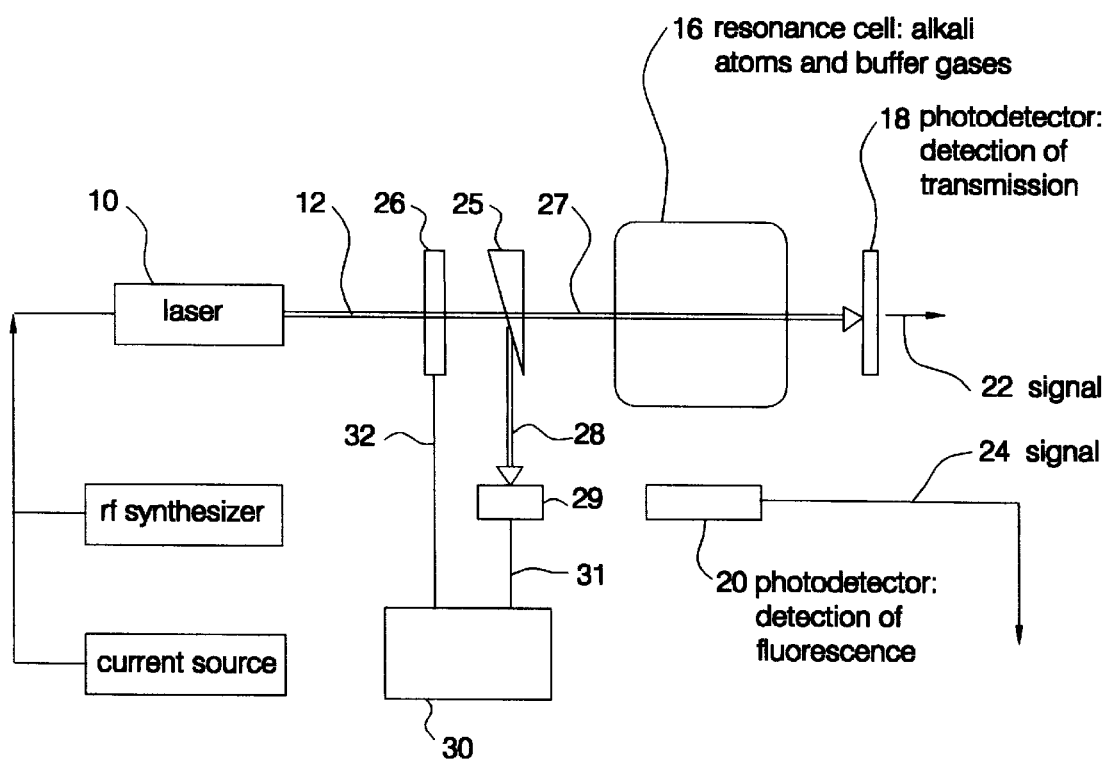

OPTICALLY PUMPED ATOMIC FREQUENCY STANDARD

BACKGROUND OF THE INVENTION

The present invention relates broadly to the field of atomic frequency standards and is more particularly directed to atomic frequency standards of the type wherein atomic resonance of source atoms is achieved by optical pumping, that is to say, by irradiating the source atoms contained in a sealed chamber with. light energy.

In one type of known optically pumped atomic frequency standard rubidium 87 atoms, in admixture with one or more noble buffer gases, are contained within a glass resonance cell situated in a microwave cavity. These rubidium atoms are excited by exposing them to the sufficiently intense radiation of an appropriately filtered rubidium 87 spectral lamp. The net effect of this filtered light radiation exposure is to cause the rubidium 87 atoms to populate the ground hyperfine level F=2 at the expense of the F=1 level, a phenomenon of atomic physics termed "population inversion." The excited atoms diffuse slowly through the noble gas atoms and during this time they interact with the microwave cavity field. When the microwave frequency corresponds to the rubidium 87 magnetic hyperfine resonance there is a change in the absorption coefficient for the optical pumping radiation and this change is detected by a photodetector stationed to intercept light transmitted through the cell.

With the advent of solid state laser technology substantial efforts have also been directed, with relative success, towards replacement of the spectral lamp optical pump described above with. a solid state diode laser emitting at the proper wavelength and at sufficient intensity, either $D_1$ or $D_2$, but tuned to one of the hyperfine ground states. Where cesium is the source resonance atom to be utilized only a laser can be utilized as the optical pump since no isotopic hyperfine filtering of a cesium spectral lamp is possible, cesium having no other stable isotopes. As in the case of the spectral lamp pumped type of atomic frequency standard described above, however, the resonance cell containing the alkali metal resonance source atoms in admixture with. one or more buffer gases, is contained within a microwave cavity tuned to the transition between which the population inversion has been created. Microwave energy is fed to the cavity and its effect on the resonance atoms, is to alter the population of the two levels of the ground state and, consequently, the optical transmission through the cell. The ground state hyperfine resonance signal is thus detected on the transmitted light and is used to lock the frequency of the microwave source used to feed the cavity.

Both of the above-described types of optically pumped atomic frequency standards, whether the exciting light source is a spectral lamp or a laser, require the presence of a tuned microwave cavity as an essential element of the standard. This requirement for a microwave cavity not only contributes to the overall mechanical and operational complexity of an atomic frequency standard based thereon and on the phenomenon of population inversion, but is also limiting of the availability of substantial reductions in the dimensions of the device. It is also of significance that both of the above-described types of atomic frequency standards are bottomed upon intensity optical pumping because, whether a spectral lamp or a laser is employed, they both rely on the intensity of the light source to prepare the resonance source atoms, rather than upon its coherence.

Even more recently, optically pumped atomic frequency standards have been developed wherein the coherence property of a laser, rather than its intensity, is utilized to prepare the energy states of the resonance source atoms and in which the quantum physics phenomenon of Coherent Population Trapping (hereinafter CPT) take place wherein population inversion is avoided and the ground state energy populations of the resonance source atoms remain unaltered. The drawing hereof depicts a generalized scheme in which the CPT frequency standard is achieved. Referring to said drawing, there is provided a sealed, optically transparent resonance cell containing the alkali metal resonance source atoms in admixture with one or more buffer gases. The beam of a laser optical pump of appropriate wavelength for the particular alkali metal utilized as the atomic resonance source is linearly and circularly polarized and then directed into said resonance cell. Where a single laser light source is employed as the optical pump it is modulated over a frequency range, including a subharmonic of the hyperfine ground state 0—0 transition frequency of the alkali metal atoms defining the atomic resonance source, thereby causing the laser to emit as sidebands two radiation fields whose frequency difference is equal to the hyperfine frequency of the atomic resonance source atoms. Where two laser sources are employed, said lasers a phase-locked to one another with a frequency separation equal to the hyperfine frequency of the atomic resonance source, thereby to also establish two radiation fields of the type described above in respect of a single laser optical pump operated with two sidebands. In either case, therefore, the alkali metal resonance source atoms within the resonance cell are submitted to these radiation fields and resonance of said atoms takes place wherein a strong coherence of the ground state occurs at the hyperfine frequency and wherein transitions to the excited P state are inhibited. Thus, at resonance, all alkali metal resonance source atoms within the resonance cell are trapped in the ground state, no transitions take place from the ground state to the excited P state and no energy is absorbed from the laser radiation due to such. transitions. The resonance phenomenon is signalled by: (a) a sharp increase in the intensity of the laser radiation transmitted through the cell along the laser beam axis and/or (b) by a sharp decrease in the intensity of fluorescence transmitted from the cell normal to the laser beam axis. Thus, either or both of these CPT resonance phenomena are detectable by stationing photodetector means: (i) to receive and detect the intensity of the laser light source beam transmitted through the resonance cell along the beam axis and/or (ii) to receive and detect the fluorescent light generated within the resonance cell normal to the beam axis. Atomic frequency standards based upon the general CPT technology outlined above hold much promise in permitting substantial reductions in size of atomic frequency standards from those of the prior art, due in large measure, to the absence, in CPT base standards, of the need for a relatively bulky and often operationally troublesome microwave cavity to surround the resonance cell.

As will be appreciated by those of skill in the art, in any optically pumped atomic frequency standard, and particularly those of the types described generally hereinabove, it is important that the light intensity of the excitation or pumping light radiation entering the resonance cell be closely controlled and maintained as constant as possible throughout the service life of the standard. In the case of the last-mentioned CPT based atomic frequency standards, for instance, undue variations in the intensity of the solid state laser beam entering the resonance cell can adversely affect both the long term stability of the signal-to-noise ratio of the standard over its service life as well as the short term A.M.

noise experienced. These fluctuations in solid state laser pumping light intensity, if not adequately controlled, can also adversely affect detected atomic frequency signal level and broaden signal width. Where A.M. noise is substantially reduced or eliminated from the pumping radiation, short term frequency stability ($\sigma(\tau)$) of the standard is substantially improved. Similar considerations attend other types of optically pumped atomic frequency standards. In accordance with the present invention, therefore, the foregoing objects have been, at least in large measure, fully achieved.

OBJECTS OF THE INVENTION

It is a principal object of the invention to provide a novel improved optically pumped atomic frequency standard.

It is another object of the invention to provide an improved optically pumped atomic frequency standard wherein constancy of the intensity of excitation light entering the resonance cell from the optical pump is maintained.

It is another object of the invention to provide an improved optically pumped atomic frequency standard wherein the constancy of the intensity of excitation light entering the resonance cell from the optical pump is maintained without altering the wavelength of said light.

It is yet another object of the invention to provide an improved optically pumped atomic frequency standard wherein the intensity of excitation light entering the resonance cell from the optical pump is controlled.

It is still another object of the invention to provide an improved optically pumped atomic frequency standard wherein the intensity of excitation light entering the resonance cell from the optical pump is maintained independently of the electrical inputs supplied to the optical pump.

Other objects and advantages of the present invention will, in part, be obvious and will, in part appear hereinafter.

SUMMARY OF THE INVENTION

In accordance with the invention an optically pumped atomic frequency standard comprising an excitation light source optical pump and a sealed resonance cell containing atomic resonance source atoms to receive the light beam radiation therein from said optical pump is provided with an optical intensity modulator system. Said optical intensity modulator system comprises two elements interposed between said optical pump and said resonance cell and disposed so as to intercept the light beam radiation therebetween. Said intercepting elements comprise a liquid crystal optical intensity modulator element and a beam splitter element adapted to partition the light beam radiation intercepted thereby into a major portion transmitted therethrough into the resonance cell and a minor portion diverted from said major portion. Intercepting said minor diverted portion of the light beam from the beam splitter is a reference photodiode producing an optical intensity output signal corresponding to the optical intensity of said minor diverted portion of the light beam. Said photodiode communicates its optical intensity output signal to a liquid crystal modulator controller which provides an output command signal to said liquid crystal modulator element, said command signal corresponding to the optical intensity of the minor diverted portion of said light beam as sensed by said reference photodiode, thereby to control said liquid crystal optical intensity modulator element and to cause said liquid crystal element to opacify and reduce light transmission therethrough in response to increased optical intensity of the light beam radiation sensed by said reference photodiode at a user controlled value of intensity and to decrease its opacity, and thus increase light transmission therethrough, in response to decreased optical intensity of the light beam radiation sensed by said photodiode at a user controlled value of intensity. In a preferred embodiment of the invention the atomic frequency standard is of the CPT type.

BRIEF DESCRIPTION OF THE DRAWING

The drawing forming part hereof is a schematic block diagram depicting a generalized CPT type embodiment of an atomic frequency standard of the invention equipped with the liquid crystal optical intensity modulator system thereof.

DETAILED DESCRIPTION OF THE INVENTION

Referring to the drawing, the details of an optically pumped atomic frequency standard and, in particular, a CPT type atomic frequency standard, have been provided hereinbefore and require no further extensive elaboration herein. Suffice it to say, the optically pumped atomic frequency standard comprises an excitation light source optical pump 10 which, in the case of a CPT standard, takes the form of a solid state laser. The excitation radiation beam 12 from said optical pump 10 is linearly polarized, then circularly polarized, such as by transmittance through a quarter wavelength plate, and thereafter introduced into a sealed optically transparent resonance cell 16 containing the alkali metal resonance source atoms, such as rubidium 85 or 87 or cesium, admixed with one or more buffer gases. In many solid state laser light sources linear polarization of the beam radiated therefrom takes place inherently as a consequence of the laser construction. As previously mentioned, atomic resonance of the source atoms is detected in a CPT type standard by means of one or both of a transmitted light photodetector 18 stationed outside and downstream from the cell 16 on the beam axis and/or a fluorescent light photodetector 20 stationed outside the cell 16 normal to the beam axis. Said detectors provide resonance signals 22 and/or 24, respectively.

In accordance with the present invention, the intensity of the excitation radiation entering the resonance cell 16 is modulated over a narrow and constant range by means of an optical intensity modulator system which comprises, inter alia, two essential elements interposed in the excitation light beam between the optical pump 10 and the resonance cell 16. Said elements comprise a beam splitter element 25 and a liquid crystal optical intensity modulator element 26. The beam splitter element 25 intercepts the excitation light beam from the optical pump 10 and partitions it into a major beam portion 27 which is transmitted therethrough to the resonance cell 16 and a minor beam portion 28 which is diverted from the major beam axis. Desirably, said beam splitter element 25 is of a type which partitions the beam into a major transmitted portion 27 constituting at least about 90% of the total excitation beam energy output of the optical pump 10 and a minor diverted beam portion 28 constituting no more, say, than about 10% of said total excitation beam energy. The beam splitter element 25 can be of any suitable type for this purpose such as, for instance, a mirror or plate type splitter, a cube type splitter or a pellicle type splitter formed from a nitrocellulose membrane.

The second element of the optical intensity modulator system of the invention interposed in the excitation light beam between the optical pump 10 and the resonance cell 16 is a liquid crystal optical intensity modulator element 26 which may be of any suitable liquid crystal type by which the intensity of the excitation light beam transmitted therethrough may be modulated. For instance, liquid crystal optical intensity modulator elements 26 based on nematic liquid crystals have been found to be generally suitable for purposes of the invention. Other liquid crystal types, such as cholesteric-nematic, smectic A and smectic D can also be useful. Such optical intensity modulator elements are known in the art and at least several of such devices of commerce include linear polarization means whereby the light beam transmitted therethrough is linearly polarized.

The optical intensity modulator system of the invention includes a reference photodiode 29 and a liquid crystal modulator controller 30. The reference photodiode 29 is stationed to receive the minor diverted portion 28 of the excitation light beam from the beam splitter 25. Said photodiode 29 thus produces an optical intensity output signal 31 which corresponds to the intensity of the light beam received by the beam splitter 25. One suitable type of reference photodiode 29 for purposes of the present invention can be, for example, a silicon PIN type photodiode. The optical intensity output signal 31 of the reference photodiode 29 is fed to a liquid crystal modulator controller 30 which can comprise the combination of microprocessor, preamplifier and servo control units wherein the reference photodiode 29 optical intensity output signal 31 is compared with selected intensity levels in the servo control unit and wherein an amplified difference signal is converted to a output command signal 32 fed to the optical intensity modulator element 26 to adjust the opacity of said liquid crystal element 26. Thus, as the reference optical intensity output signal 31 of the photodiode 29 increases in response to increasing intensity of the excitation light beam, the output command signal 32 of the modulator controller 30 is increased to opacify the liquid crystal optical intensity modulator element 26 and to thereby reduce the intensity of the excitation light beam permitted to be transmitted therethrough. Likewise, as the optical intensity output signal 31 of the reference photodiode 29 decreases in response to decreasing intensity of the minor diverted portion 28 of the excitation light beam, the output command signal 32 of the liquid crystal modulator controller 30 is decreased to reduce the opacity of the liquid crystal optical intensity modulator element 26, thereby to increase the intensity of the excitation light beam permitted to be transmitted therethrough. In this manner the constancy and control of the intensity of the excitation light beam entering the resonance cell 16 is markedly improved, yielding such substantial functional benefits in the resulting atomic frequency standard as reduced A.M. or short term noise, increased signal-to-noise ratios, correction of long term drift due to aging optical pump components and a substantial reduction in need for user adjustments over the service life of the frequency standard. Moreover, as will be noted, the optical intensity modulator system of the invention can function independently of the other electronic systems of the optically pumped atomic frequency standard, such as the rf synthesizer or current source serving the optical pump 10 and this feature of independent operation also constitutes a substantial benefit in that it simplifies construction of the frequency standard and assures that operation of the optical intensity modulator system neither interferes with nor adversely affects the operation of any other system of said standard.

Liquid crystal optical intensity modulator systems of the type utilized in the improved optically pumped atomic frequency standard of the invention are generally known and are available from such domestic sources as Cambridge Research and Instrumentation, Inc., of Boston, Mass. and Meadowlark Optics of Frederick, Colo. It should be further mentioned that the art of fabrication of solid state laser optical pump sources has progressed to the point that several of the optical intensity modulator elements of the present invention can be formed integrally therewith. Thus, solid state laser diode optical pumps 10 can be fabricated with one or more of the following optical intensity modulator elements formed integrally therewith: liquid crystal modulator element 26, beam splitter element 25 and reference photodiode 29. Such integration of elements with the optical pump 10 can, of course, result in atomic frequency standards of substantial compactness and which, in addition, are relatively more easily fabricated than when separate and distinct components for the optical intensity modulator system are employed.

While the invention has been described above with respect to certain preferred embodiments thereof, it is obvious that it is subject to many modifications, alterations, additions and equivalents without departing from its essential scope and spirit. For instance, while the foregoing detailed description and the drawing hereof expressly refer to an atomic frequency standard of the CPT type and to a standard wherein the optical pump is in the nature of a solid state laser it is obvious that the optical intensity modulator system hereof can also be employed with great advantage in substantially any type of optically pumped atomic frequency standard, including those in which the optical pump is in the nature of a spectral lamp and those in which the resonance cell resides within a microwave cavity. In addition, optical modifiers other than polarizers and the intensity modulator system of the invention may be adjuntively employed to modify the excitation light beam as may be necessary or desirable. For instance, the excitation light beam may also be passed through such optical modifiers as collimators, beam expanders and the like. Accordingly, it should be noted and understood that the scope of the invention is intended to be determined only by reference to the appended claims.

What is claimed is:

1. In an optically pumped atomic frequency standard comprising an optical pump to produce a beam of excitation light and a sealed optically transparent resonance cell containing resonance source atoms therein, said cell receiving said excitation light beam thereinto, the improvement which comprises an optical intensity light modulator system including: a liquid crystal optical intensity modulator element interposed between said optical pump and said cell to intercept said excitation light beam; a beam splitter element interposed between said liquid crystal optical intensity modulator element and said cell to intercept said excitation light beam transmitted through said liquid crystal optical intensity modulator element and to partition said beam into a major beam portion transmitted therethrough and into said resonance cell and a minor beam portion diverted from said major beam portion; a reference photodiode to receive said minor beam portion and to produce an optical intensity output signal corresponding to the optical intensity of said minor beam portion; a liquid crystal modulator controller to receive said optical intensity output signal from said reference photodiode, to compare said output signal with preset optical intensity levels and to provide an output command signal to said liquid crystal optical intensity modulator element responsive to said comparison, thereby to cause said liquid crystal optical intensity modulator element to control the intensity of the excitation light beam permitted to pass therethrough.

2. The atomic frequency standard of claim 1 wherein said optical pump is a solid state laser.

3. The atomic frequency standard of claim 1 of the CPT type.

4. The atomic frequency standard of claim 1 wherein said liquid crystal optical intensity modulator element comprises a nematic crystal.

5. The atomic frequency standard of claim 1 wherein said beam splitter element permits at least about 90% of the excitation light beam intercepted thereby to be transmitted therethrough to said major beam portion.

6. The atomic frequency standard of claim 2 wherein said liquid crystal optical intensity modulator element is integral with said laser.

7. The atomic frequency standard of claim 2 wherein said liquid crystal optical intensity modulator element, said beam splitter and said reference photodiode are integral with said laser.

* * * * *